(12) United States Patent
Brodsky et al.

(10) Patent No.: US 7,494,919 B2
(45) Date of Patent: Feb. 24, 2009

(54) METHOD FOR POST LITHOGRAPHIC CRITICAL DIMENSION SHRINKING USING THERMAL REFLOW PROCESS

(75) Inventors: Colin J. Brodsky, Salt Point, NY (US); Scott D. Allen, Ledgewood, NJ (US)

(73) Assignee: International Business Machines Corporation, Armonk, NY (US)

( * ) Notice: Subject to any disclaimer, the term of this patent is extended or adjusted under 35 U.S.C. 154(b) by 409 days.

(21) Appl. No.: 10/905,579

(22) Filed: Jan. 12, 2005

(65) Prior Publication Data
US 2006/0154412 A1    Jul. 13, 2006

(51) Int. Cl.
*H01L 21/4763* (2006.01)
(52) U.S. Cl. .............................. 438/629; 257/E21.649
(58) Field of Classification Search .................. 438/444, 438/445, 942, 947, 428, 436, 438
See application file for complete search history.

(56) References Cited

U.S. PATENT DOCUMENTS

| 4,864,581 | A | * | 9/1989 | Nelson et al. ................ 438/758 |
| 5,804,088 | A | * | 9/1998 | McKee ......................... 216/47 |
| 6,010,829 | A | | 1/2000 | Rogers et al. |
| 6,365,325 | B1 | | 4/2002 | Chiang et al. |
| 6,589,718 | B2 | | 7/2003 | Saito |
| 6,699,641 | B1 | | 3/2004 | Hellig et al. |
| 6,784,005 | B2 | * | 8/2004 | Lin et al. ...................... 438/16 |
| 2003/0092281 | A1 | | 5/2003 | Ramachandramurthy et al. |
| 2005/0170628 | A1 | * | 8/2005 | Sharma et al. .............. 438/612 |
| 2006/0063369 | A1 | * | 3/2006 | Lu et al. ..................... 438/618 |

FOREIGN PATENT DOCUMENTS

JP          62237762    * 10/1987   ................. 438/514

OTHER PUBLICATIONS

Cox et al.; "Developer Soluble Organic BARCs for KrF Lithography;" 2003 Society of Photo-Optical Instrumentation Engineers.
WIDE—Wet Developable-iLine Anti-Reflective Coating—Brochure from Brewer Science Inc.

* cited by examiner

*Primary Examiner*—Thao P. Le
(74) *Attorney, Agent, or Firm*—Cantor Colburn LLP; Steven Capella

(57) ABSTRACT

A method for reducing the size of a patterned semiconductor feature includes forming a first layer over a substrate to be patterned, and forming a photoresist layer over the first layer. The photoresist layer is patterned so as to expose portions of the first layer, and the exposed portions of the first layer are removed in a manner so as to create an undercut region beneath the patterned photoresist layer. The patterned photoresist layer is reflowed so as to cause reflowed portions of the patterned photoresist layer to occupy at least a portion of the undercut region.

12 Claims, 5 Drawing Sheets

METHOD FOR POST LITHOGRAPHIC CRITICAL DIMENSION SHRINKING USING THERMAL REFLOW PROCESS

BACKGROUND OF THE INVENTION

The present invention relates generally to semiconductor device manufacturing, and, more particularly, to a method for post lithographic critical dimension shrinking including a thermal reflow process.

The fabrication of integrated circuits on a semiconductor substrate typically includes multiple photolithography steps. A photolithography process begins by applying a thin layer of a photoresist material to the substrate surface. The photoresist is then exposed through a photolithography exposure tool to a radiation source that changes the solubility of the photoresist at areas exposed to the radiation. The photolithography exposure tool typically includes transparent regions that do not interact with the exposing radiation and a patterned material or materials that do interact with the exposing radiation, either to block it or to shift its phase.

As each successive generation of integrated circuits crowds more circuit elements onto the semiconductor substrate, it becomes necessary to reduce the size of the features, i.e., the lines and spaces that make up the circuit elements. The minimum feature size that can be accurately produced on a substrate is limited by the ability of the fabrication process to form an undistorted optical image of the mask pattern onto the substrate, by the chemical and physical interaction of the photoresist with the developer, and by the uniformity of the subsequent process (e.g., etching or diffusion) that uses the patterned photoresist.

Advanced lithography processes are extremely expensive and have driven exponential cost increases in semiconductor manufacturing. As such, advanced lithography for formation of structures such as contact holes has become increasingly reliant on "shrink" methods in which a contact hole is imaged at a critical dimension (CD) larger than the target dimension, and is thereafter reduced to the target dimension through some post-lithography process. Many different processes are under development/exploration by resist vendors, as well as device manufacturers, using a wide range of techniques including reflow, etch tapering in intermediate layers, and overcoats that bind to the existing pattern with finite thickness.

In particular, thermal reflow processes can enable dramatic cost savings by allowing lithographic images at dimensions well above the target CD and subsequently achieving the target CD by "reflow" of the resist material to drive a lateral shrink. This can defer the need for costly mask technologies, or advanced lithography tooling, leading to lower process cost of ownership. It is a particularly promising technique for contact and via level formation.

Unfortunately, conventional thermal reflow commonly suffers profile degradation during the thermal flow step. More specifically, severe "footing" is observed wherein gravitational flow accumulates resist at the lower part of the feature while also laterally shrinking the feature. This effect is one of the most significant limitations to implementation of thermal flow processes, since the resulting degraded profile impairs the reactive ion etch (RIE) process, leading to line edge roughness and highly tapered profiles following the etch.

SUMMARY OF THE INVENTION

The foregoing discussed drawbacks and deficiencies of the prior art are overcome or alleviated by a method for reducing the size of a patterned semiconductor feature. In an exemplary embodiment, the method includes forming a first layer over a substrate to be patterned, and forming a second layer over the first layer. The second layer is patterned so as to expose portions of the first layer, and the exposed portions of the first layer are removed in a manner so as to create an undercut region beneath the patterned second layer. The patterned second layer is reflowed so as to cause reflowed portions of the patterned second layer to occupy at least a portion of the undercut region.

In another embodiment, a method for reducing the size of a patterned semiconductor feature includes forming a first layer over a substrate to be patterned, and forming a photoresist layer over the first layer. The photoresist layer is patterned so as to expose portions of the first layer, and the exposed portions of the first layer are removed in a manner so as to create an undercut region beneath the patterned photoresist layer. The patterned photoresist layer is reflowed so as to cause reflowed portions of the patterned photoresist layer to occupy at least a portion of the undercut region.

BRIEF DESCRIPTION OF THE DRAWINGS

Referring to the exemplary drawings wherein like elements are numbered alike in the several Figures.

DETAILED DESCRIPTION OF THE INVENTION

Figure 1A:
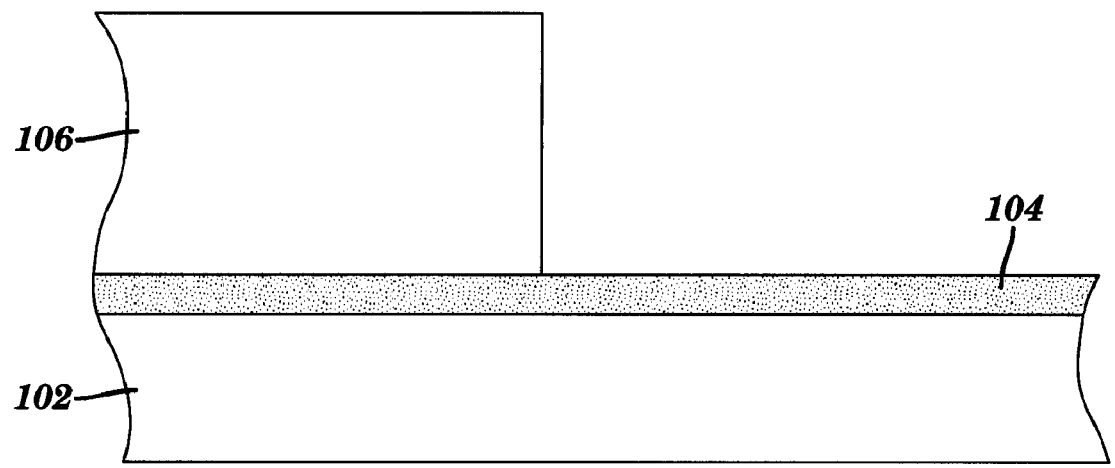
FIGS. 1(a) through 1(d) illustrate a conventional reflow process for implementing post lithographic critical dimension shrinking.

Disclosed herein is a method for post lithographic critical dimension shrinking, using a thermal reflow process over an undercut substrate. In so doing, the reflowed resist material occupies the space defined by the undercut, thereby eliminating the buildup of reflowed resist at the bottom of the layer.

In recent years, there has been increasing focus on the use of wet-developable bottom antireflective coatings (BARCs). As is known in the art, BARCs are undercoating materials used to improve the lithographic performance of the imaging layer. In a conventional process, the developed resist image is used as a mask as the exposed BARC is removed with an additional dry etch process. On the other hand, with a wet developable BARC, the BARC may be effectively etched away by the developer solution immediately following lithographic imaging. One side effect of using a wet developable BARC is that the developer can etch the BARC material both downward and laterally, leading to an undercut profile with respect to the resist layer. From a conventional process perspective, this effect has heretofore been perceived as a disadvantage of wet developable BARCs; however, the present invention embodiments advantageously exploit a controlled undercut to assist a resist thermal reflow process, as discussed below.

Referring initially to FIGS. 1(a) through 1(d), there is shown a conventional reflow process sequence for implementing post lithographic critical dimension shrinking. As particularly shown in FIG. 1(a), a substrate 102 has a BARC layer 104 formed thereupon, followed by a layer of photoresist 106. At the stage of processing shown, the resist layer 106 has been patterned developed to form a desired feature, such as a contact opening, for example, to be transferred into the substrate layer 102 below. As indicated previously, the patterned feature is initially larger than desired, due to resolution issues with the imaging equipment. Although the substrate 102 may generally represent any formed layer in a semiconductor process, the exemplary processing step is particularly suited for contact and via processing, where patterned features are sought to be shrunk following the initial resist exposure and one critical dimension predominates. Via processing in back end of line (BEOL) processing has many more layers and would represent another suitable candidate for the present process.

Figure 1B:
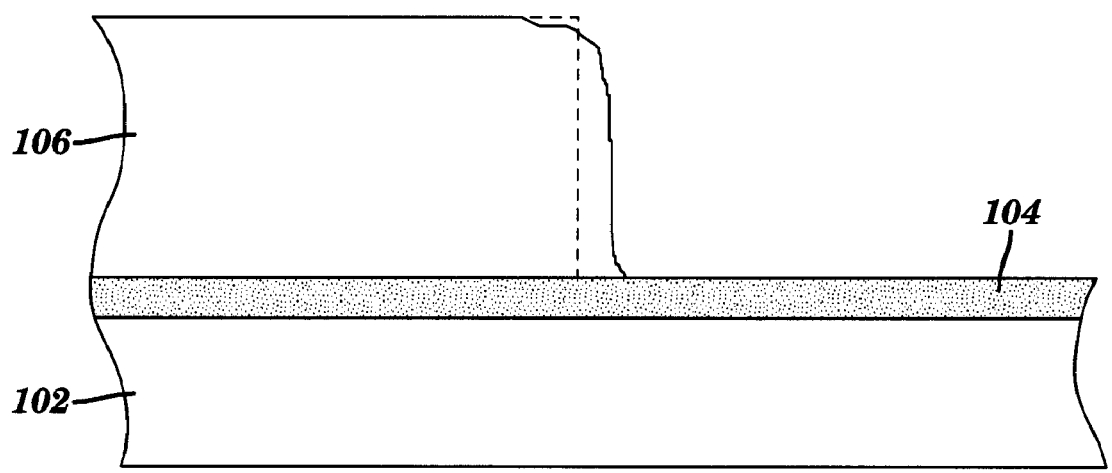
Figure 1C:
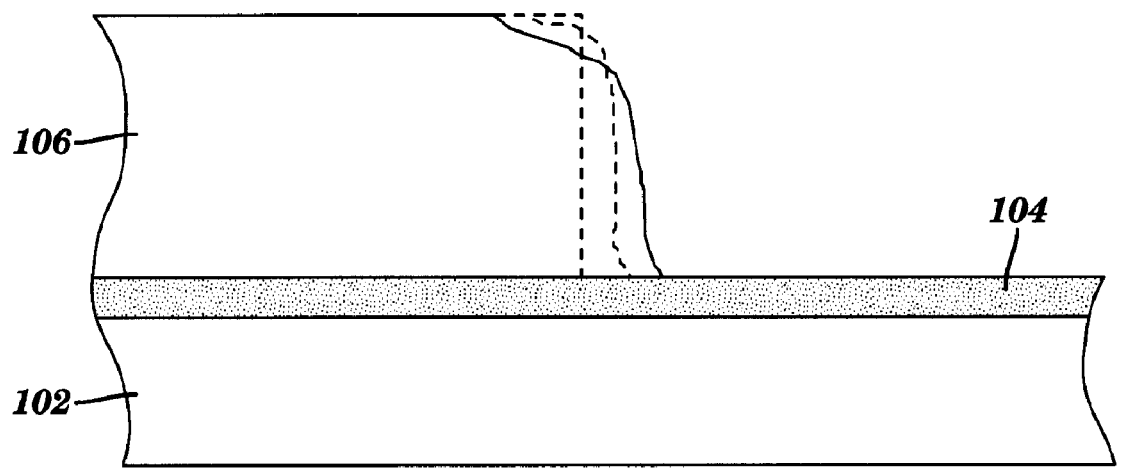
Figure 1D:
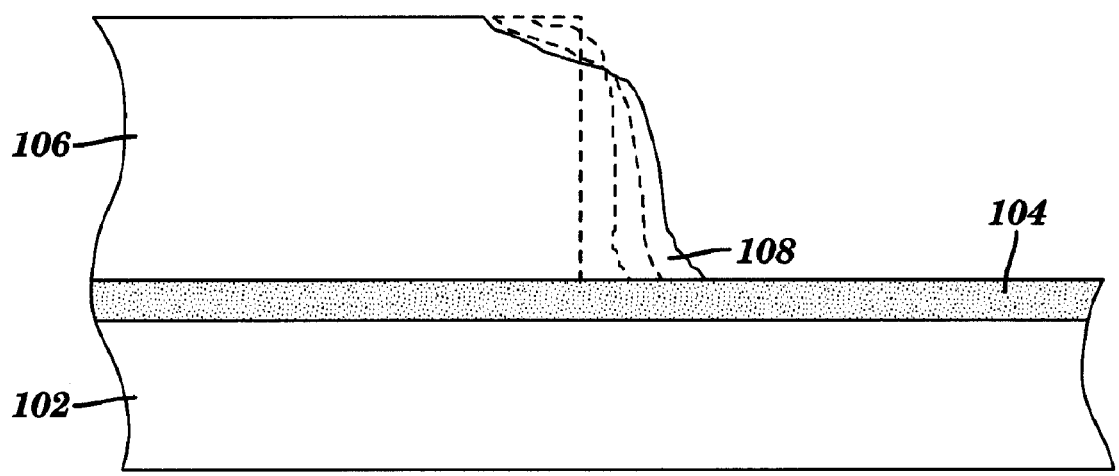

As shown FIGS. 1(b) and 1(c), a thermal reflow process is implemented prior to the opening of the exposed BARC layer 104 (by a subsequent dry RIE process). Under thermal flow, gravitational forces compress the thickness of the resist 106, leading to a lateral shrinkage thereof, while at the same time creating a downward flow. This downward flow of resist tends to accumulate and create a "foot," characterized by a taper at the bottom of the post reflow profile. In FIGS. 1(b) through 1(d), it will be noted that the dashed lines indicate earlier stages of the reflow for purposes of comparison. The resulting definition of the foot 108 is shown in FIG. 1(d). As indicated previously, the formation of such foot as a result of conventional reflow creates problems during subsequent RIE of the patterned substrate 102 and leads to high edge roughness.

Figure 2:
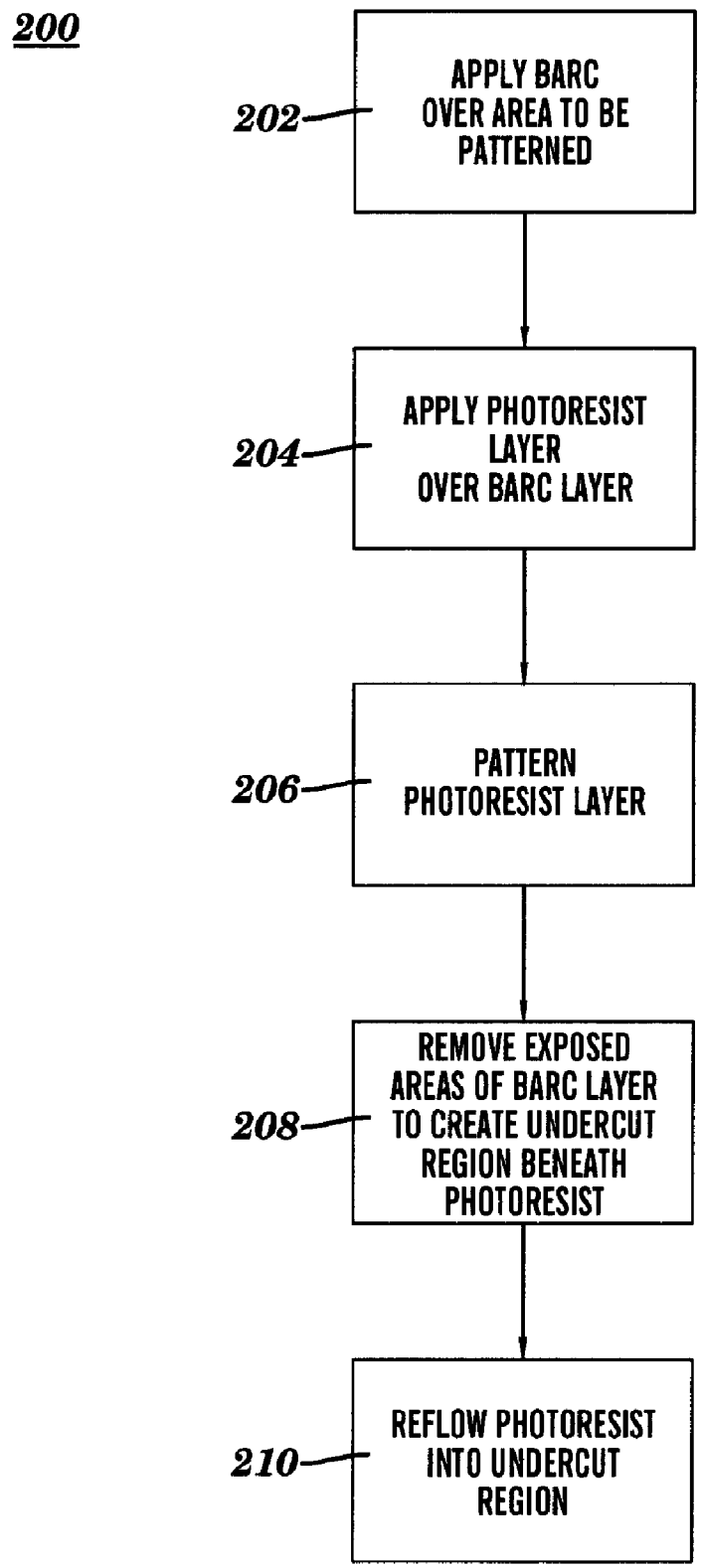
FIG. 2 is a process flow diagram for implementing post lithographic critical dimension shrinking, using a thermal reflow process over an undercut substrate, in accordance with an embodiment of the invention.

Therefore, in accordance with an embodiment of the invention, FIG. 2 is a process flow diagram 200 illustrating a method for post lithographic critical dimension shrinking, in which the problem of foot formation during reflow is eliminated. Initially, a layer of BARC is applied over an area to be patterned, as shown in block 202. Thereafter, a photoresist layer is formed over the BARC layer, as shown in block 204. The photoresist layer is patterned in block 206 to create openings therein in accordance with the desired features to be translated to the substrate beneath the BARC layer, once the features are shrunk by a reflow process.

In contrast to a conventional reflow processes, the exposed areas of the BARC layer are then removed in a manner that also creates an undercut region beneath the edges of the remaining photoresist layer, as shown in block 208. In an exemplary embodiment, the undercut region is facilitated by the use of a wet-developable BARC with a tuned undercut that creates a mild gap under the photoresist layer. Wet developable BARCs have been made commercially available for 365 nm (i-line) and 248 nm (DUV) lithography applications, and are being developed for 193 nm lithography. Accordingly, one suitable BARC material that may be used in this regard is Imbarc™, available from Brewer Science. In conjunction with such a wet-developable BARC, a corresponding positive tone resist material that employs a polymethylmethacrylate (PMMA) polymer material is desirably used, which can undergo thermal reflow after developing the BARC so as to leave a controlled undercut. For example, the 193 nm reflow-capable resist (Shipley XP 11016), published in SPIE proceedings, Volume 4691 (2002) page 1513, is a suitable exemplary resist material. In addition, the commercially available JSR 1863J contact hole resist is another suitable photoresist material for the present reflow application.

It will be appreciated that the BARC development and subsequent undercut steps may also be accomplished simultaneously with the lithography pattern formation in the resist. (In other words the steps outlined in blocks 206 and 208 may be accomplished in a single develop operation.) Then, in block 210, a reflow (e.g., thermal reflow) process is implemented. As the bulk resist material undergoes thermal flow, the lateral and downward flow mechanisms are seen. However, due to the presence of the undercut region, there is no immediate horizontal surface for the downward flowing resist to accumulate on and begin creating a tapered foot. Accordingly, by appropriately balancing the BARC undercut with the thermal flow properties of the resist material, an improved, more continuous sidewall and bottom profile may be engineered, which is beneficial for clean etch performance.

Figure 3A:
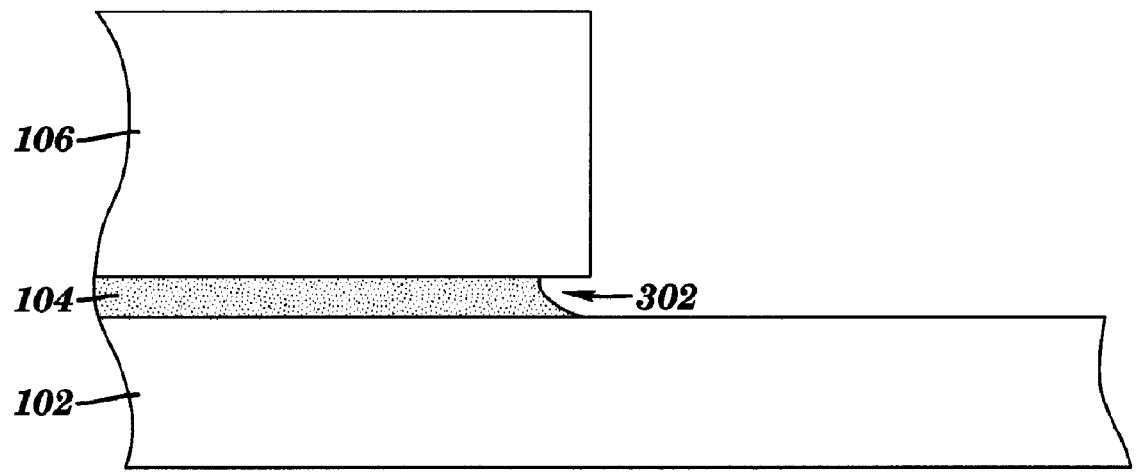
FIGS. 3(a) through 3(d) are cross sectional views of an exemplary undercut reflow process outlined in FIG. 2.

FIGS. 3(a) through 3(d) are cross sectional views particularly illustrating an exemplary undercut reflow process as outlined in FIG. 2. FIG. 3(a) illustrates the initial formation of an undercut region 302 beneath the edge of the photoresist layer 106. Again, it should be appreciated that although the use of a wet-developable BARC is one way of generating the undercut profile, this may be achieved through any suitable technique that creates the desired gap under the edge of the resist material that is to be reflowed. On the other hand, advances in wet-BARC development have demonstrated that the magnitude of the undercut, thickness of the BARC layer (and corresponding undercut gap) and shape profile of the undercut front may be readily modulated based on the design of the materials.

Figure 3B:
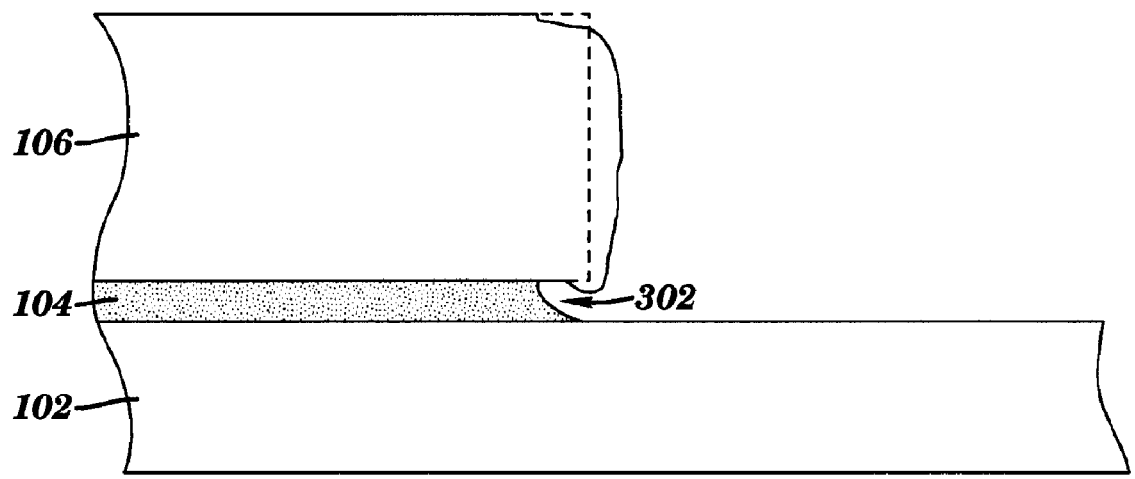
Figure 3C:
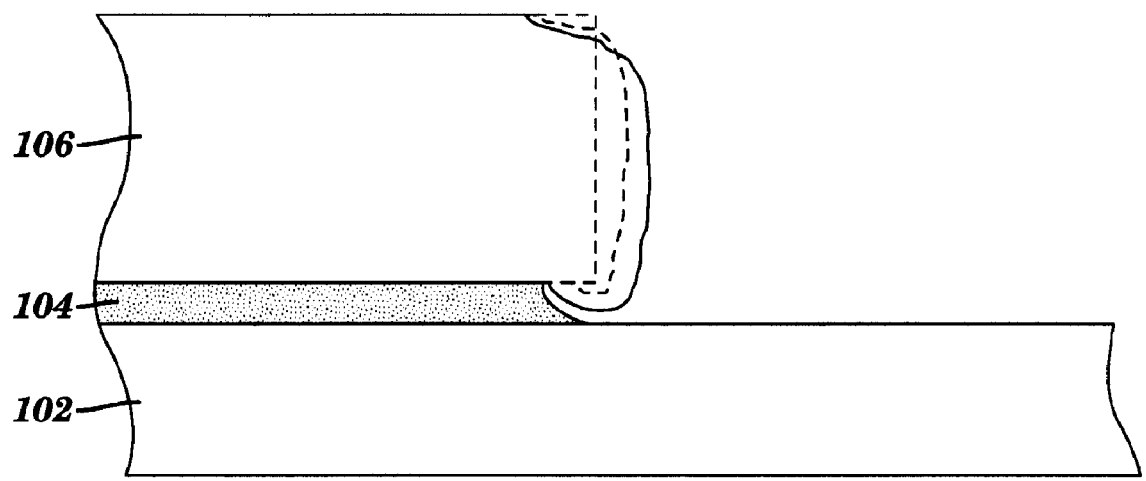
Figure 3D:
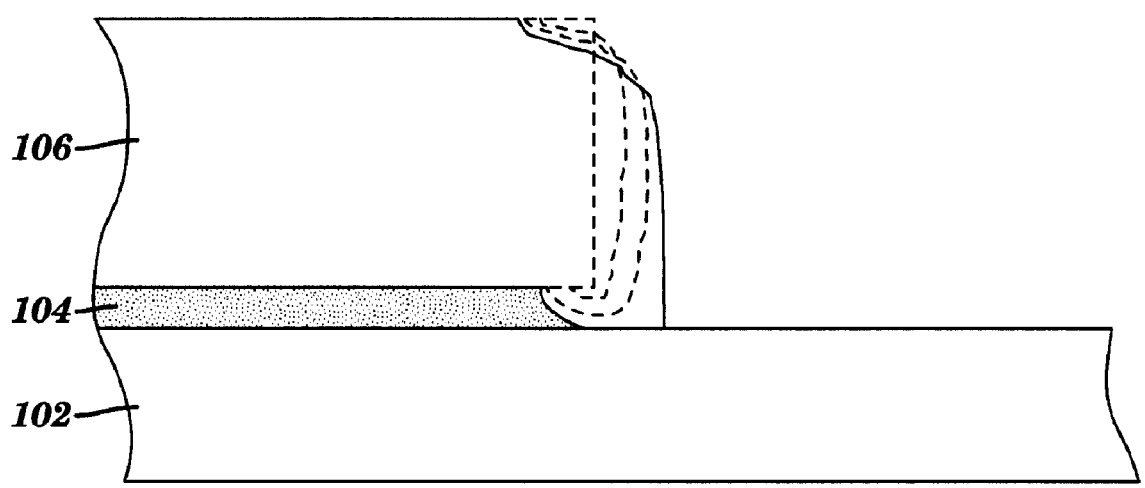

In FIG. 3(b), it is seen that as the reflow of the resist layer 106 is commenced, the lower portion of the reflowed resist material begins to collect within the gap 302, since there is no horizontal surface immediately below the bottom edge of the resist upon which a footing would form. In FIG. 3(c), the reflowed resist continues to occupy the void of the undercut region until eventually the reflow resist comes into contact with the substrate 102, as shown in FIG. 2(d). At this point, however, it can be seen that the vertical profile of the sidewalls is improved with respect to FIG. 1(d), in that no foot is formed.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a semiconductor device, the method comprising:

forming a first layer over a substrate to be patterned, said first layer further comprising a bottom antireflective coating (BARC) layer;

forming a second layer over said first layer;

patterning said second layer so as to expose portions of said first layer;

removing said exposed portions of said first layer in a mariner so as to create an undercut region beneath said patterned second layer; and reflowing said patterned second layer so as to cause reflowed portions of said patterned second layer to occupy at least a portion of said undercut region, wherein said reflowed second layer results in the reduction of the size of a patterned semiconductor feature.

2. The method of claim 1, wherein said BARC layer further comprises a wet-developable BARC layer.

3. The method of claim 2, wherein said removing said BARC layer is implemented through etching following said patterning said second layer.

4. The method of claim 1, wherein said patterned second layer is reflowed until said reflowed portions are brought into contact with said substrate.

5. The method of claim 1, wherein said patterning said second layer is implemented simultaneously with said removing said exposed portions of said first layer.

6. A method for forming a semiconductor device, the method comprising:
   forming a first layer over a substrate to be patterned, said first layer further comprising a bottom antireflective coating (BARC) layer;
   forming a photoresist layer over said first layer;
   patterning said photoresist layer so as to expose portions of said first layer;
   removing said exposed portions of said first layer in a manner so as to create an undercut region beneath said patterned photoresist layer; and
   reflowing said patterned photoresist layer so as to cause reflowed portions of said patterned photoresist layer to occupy at least a portion of said undercut region, wherein said reflowed patterned photoresist layer results in post lithographic critical dimension shrinking of a patterned semiconductor feature.

7. The method of claim 6 wherein said BARC layer further comprises a wet-developable BARC layer.

8. The method of claim 7, wherein said removing said BARC layer is implemented through etching by a developer solution following said patterning said photoresist layer.

9. The method of claim 7, wherein said patterning said photoresist layer is implemented simultaneously with said removing said BARC layer in a single develop operation.

10. The method of claim 6, wherein said patterned photoresist layer is reflowed until said reflowed portions are brought into contact with said substrate.

11. The method of claim 1, further comprising implementing the reflowing in a manner so as to laterally and downwardly move the second layer while maintaining a substantially vertical sidewall profile thereof.

12. The method of claim 6, further comprising implementing the reflowing in a manner so as to laterally and downwardly move the photoresist layer while maintaining a substantially vertical sidewall profile thereof.

* * * * *